US012598836B1

(12) United States Patent
Yap et al.

(10) Patent No.: US 12,598,836 B1
(45) Date of Patent: Apr. 7, 2026

(54) PHOTONIC INTEGRATED MODULE WITH METAL EMBEDDED CHIPS

(71) Applicant: HRL Laboratories, LLC, Malibu, CA (US)

(72) Inventors: Daniel Yap, Newbury Park, CA (US); Florian G. Herrault, Agoura Hills, CA (US); Christopher S. Roper, Oak Park, CA (US); Partia Naghibi, Canoga Park, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 0 days.

(21) Appl. No.: 18/364,455

(22) Filed: Aug. 2, 2023

Related U.S. Application Data

(62) Division of application No. 16/888,480, filed on May 29, 2020, now Pat. No. 11,769,843.

(60) Provisional application No. 62/880,417, filed on Jul. 30, 2019.

(51) Int. Cl.
| | |
|---|---|
| *H10F 77/40* | (2025.01) |
| *G02B 6/42* | (2006.01) |
| *H10H 20/858* | (2025.01) |

(52) U.S. Cl.
CPC ............. *H10F 77/413* (2025.01); *G02B 6/42* (2013.01); *H10F 77/407* (2025.01); *H10H 20/858* (2025.01)

(58) Field of Classification Search
CPC ......... H01L 31/02327; H01L 31/02325; H01L 31/024; H01L 33/64; G02B 6/42; H10F 77/413; H10F 77/407; H10H 20/858

USPC .......................................................... 257/432
See application file for complete search history.

(56) References Cited

U.S. PATENT DOCUMENTS

| | | | | | |
|---|---|---|---|---|---|
| 4,293,826 | A | * | 10/1981 | Scifres ................... | H01S 5/4025 |
| | | | | | 372/50.21 |
| 4,474,422 | A | * | 10/1984 | Kitamura ............. | G02B 26/123 |
| | | | | | 359/204.1 |
| 5,521,931 | A | * | 5/1996 | Biegelsen ............. | H01S 5/4031 |
| | | | | | 372/50.12 |
| 5,640,188 | A | * | 6/1997 | Andrews ................... | B41J 2/473 |
| | | | | | 347/245 |
| 5,898,211 | A | * | 4/1999 | Marshall ................. | H01S 5/405 |
| | | | | | 257/713 |
| 6,636,538 | B1 | * | 10/2003 | Stephens ............. | H01S 5/02423 |
| | | | | | 372/45.01 |
| 9,214,404 | B1 | * | 12/2015 | Margomenos .......... | H01L 24/20 |
| 9,385,083 | B1 | * | 7/2016 | Herrault ................. | H01L 25/16 |

(Continued)

OTHER PUBLICATIONS

From U.S. Appl. No. 16/888,480 (now U.S. Pat. No. 11,769,843), Notice of Allowance mailed on Jun. 13, 2023.

(Continued)

*Primary Examiner* — Bitew A Dinke
(74) *Attorney, Agent, or Firm* — Ladas & Parry, LLP

(57) ABSTRACT

A photonic module and a method of making same, the module having one or more optoelectronic chips, such as a laser diode typically having six sides, with each optoelectronic chip having two opposing sides (a first side and a second side) abutting and electrically connected to metal regions (preferably electro-formed), the two metal regions are physically distinct and electrically separate from each other, the two electro-formed metal regions serving, in use, as heat spreaders for conducting heat away from the optoelectronic chip.

18 Claims, 13 Drawing Sheets

(56)          References Cited

U.S. PATENT DOCUMENTS

| | | | | |
|---|---|---|---|---|
| 10,026,672 | B1 * | 7/2018 | Herrault | H01L 23/3675 |
| 10,079,160 | B1 * | 9/2018 | Margomenos | H01L 21/4871 |
| 11,769,843 | B1 | 9/2023 | Yap | |
| 2002/0110952 | A1 * | 8/2002 | Gris | H01L 24/24 |
| | | | | 257/E21.705 |
| 2006/0105496 | A1 * | 5/2006 | Chen | H01L 24/94 |
| | | | | 257/E21.597 |
| 2007/0187629 | A1 * | 8/2007 | Matsuyama | H01L 31/14 |
| | | | | 257/E31.097 |
| 2008/0089371 | A1 * | 4/2008 | Reichert | H01S 5/4025 |
| | | | | 372/34 |
| 2008/0224320 | A1 * | 9/2008 | Palmade | H01L 24/83 |
| | | | | 257/E23.079 |
| 2009/0010011 | A1 * | 1/2009 | Tseng | H01L 33/64 |
| | | | | 362/373 |
| 2010/0215314 | A1 * | 8/2010 | Lau | G02B 6/43 |
| | | | | 385/47 |
| 2012/0037935 | A1 * | 2/2012 | Yang | H01L 33/641 |
| | | | | 257/E33.056 |
| 2013/0105950 | A1 * | 5/2013 | Bergemont | H01L 23/552 |
| | | | | 257/659 |
| 2013/0215613 | A1 * | 8/2013 | Wu | F21K 9/20 |
| | | | | 362/249.02 |
| 2013/0272330 | A1 * | 10/2013 | Joseph | H01S 5/023 |
| | | | | 372/36 |
| 2016/0274319 | A1 * | 9/2016 | Krasulick | G02B 6/12004 |
| 2016/0293557 | A1 * | 10/2016 | Topak | H01P 3/14 |
| 2016/0306042 | A1 * | 10/2016 | Schrank | G01S 17/04 |
| 2017/0182590 | A1 | 6/2017 | Goya | |
| 2018/0011248 | A1 * | 1/2018 | Bourstein | G02B 6/122 |
| 2018/0233535 | A1 * | 8/2018 | Bono | H10H 29/14 |
| 2018/0375285 | A1 * | 12/2018 | Seidel | H01S 5/0235 |
| 2019/0019899 | A1 * | 1/2019 | Wang | H01L 31/02 |
| 2019/0198449 | A1 * | 6/2019 | Herrault | H01L 25/50 |
| 2020/0035653 | A1 * | 1/2020 | Chong | G09G 3/22 |
| 2020/0083662 | A1 * | 3/2020 | Lambert | G02B 6/136 |
| 2020/0294816 | A1 * | 9/2020 | Herrault | H01L 21/6835 |
| 2021/0020688 | A1 * | 1/2021 | Templier | H10H 29/142 |
| 2021/0167124 | A1 * | 6/2021 | Min | H10H 20/821 |
| 2022/0013980 | A1 * | 1/2022 | König | H01S 5/023 |

OTHER PUBLICATIONS

From U.S. Appl. No. 16/888,480 (now U.S. Pat. No. 11,769,843), Office Action mailed on Mar. 16, 2023.
From U.S. Appl. No. 16/888,480 (now U.S. Pat. No. 11,769,843), Office Action mailed on Sep. 16, 2022.
From U.S. Appl. No. 16/888,480 (now U.S. Pat. No. 11,769,843), Office Action mailed on May 26, 2022.

* cited by examiner

Clear path for the light

Fig. 3(c-1)

Plating block
25

Frame 27

Wick 18

Plating block
25

Optical element
Plating mold 21, 23

Optical element 19, 14$_M$
Frame 27

Sticky tape 33

Optoelectronic
chip 12

Carrier wafer 30

Plating block
25

Frame 27        Wick 18

Plating block
25

32

Optical element 19, 12$_M$
Frame 27

33

32

Optoelectronic        32
chip 12

Carrier wafer 30

32

End cover 24

Dielectric cover 22 ⁄ 12

End cover 24

Heat exchanger

Vapor chamber lid 20

Dielectric cap 16

Condenser

End cover 24

Dielectric cover 22 ⁄ 12

End cover 24

Reflective Lens

Vapor chamber compartment for fluid 26C and vapor 26V

PHOTONIC INTEGRATED MODULE WITH METAL EMBEDDED CHIPS

CROSS REFERENCE TO RELATED APPLICATIONS

This application is a divisional of U.S. patent application Ser. No. 16/888,480 filed on May 29, 2020 which claims the benefit of U.S. Provisional Patent Application Ser. No. 62/880,417 filed on 30 Jul. 2019 and entitled "Photonic Integrated Module with Metal Embedded Chips", the disclosures of which are hereby incorporated herein by reference.

STATEMENT REGARDING FEDERALLY SPONSORED RESEARCH OR DEVELOPMENT

None.

TECHNICAL FIELD

This disclosure relates to photonic modules that are capable of removing heat generated, for example, by a laser associated therewith.

BACKGROUND

Typical laser chips, from which heat must be removed effectively, are mounted with their epitaxial layers, and thus the side of the chip 12 containing the active region or device $12_A$, facing a heat spreader 14 (see FIG. 1a). Another side of the heat spreader 14 (typically a side opposite the side facing the laser chips 12) can then be connected (using solder or an epoxy) to a different structure 16 that contains a coolant fluid or vapor for removing the heat. If two or more laser chips 12 are mounted on the same heat spreader 14 and those multiple laser chips 12 are to have separately controllable electrical contacts, the heat spreader 14 must comprise a dielectric material. The thermal conductivity of dielectric materials range from being excellent (such as 2000 W/m·K for crystalline diamond) to being fairly good (such as 200-500 W/m·K for silicon carbide and ~170 W/m·K for aluminum nitride). In comparison, the thermal conductivity of a typical metal heat spreader material such as copper is 400 W/m·K. The heat spreader 14 then conducts the heat to structure 16 exposed to a coolant fluid or vapor, or even to flowing air.

Typically, the dielectric heat spreaders have a thin layer of metal deposited on the side of the heat spreader onto which the chips are mounted. A metal-to-metal bond (such as thermo-compression) can be used to attach the chip to the heat spreader. However, this bonding or chip-attachment process involves exposing the chip to high force and also high temperature (e.g., 300 degrees-Celsius and higher). Although heat spreader materials such as diamond or copper have higher thermal conductivity, their coefficient of thermal expansion is poorly matched to that of the InP or GaAs substrate material of typical laser chips. Thus, the large change in temperature associated with the high-temperature bonding process produces stresses in the chip that can degrade the reliability of the optoelectronic device. In order to avoid subjecting the chip to such high heat and high force, a solder material that reflows at a lower temperature is often used. Also, a heat spreader, such as SiC or AlN, whose thermal expansion coefficient is better matched to that of InP or GaAs but whose thermal conductivity is poorer is often used. However, use of a solder and of the lower thermal conductivity heat spreader increases the thermal resistance of the path between the chip and the coolant and thus increases the temperature of the laser chips when the lasers are operating.

BRIEF DESCRIPTION OF THE INVENTION

HRL Laboratories. LLC has developed a multi-chip assembly and integration process based on embedding the chips in electro-formed copper. See U.S. Pat. No. 10,079, 160 which issued on 18 Sep. 2018 to HRL Laboratories LLC (Margomenos et al. inventors), the disclosure of which is hereby incorporated herein by reference. This Metal-Embedded Chip Assembly (MECA) process is illustrated in FIG. 2. According to this process, various chips of diverse shapes and sizes, are placed and secured temporarily onto a carrier wafer. These chips are placed with their top side or the epi-side (that has the epitaxial layers) facing the carrier wafer. An outer frame is also placed onto the carrier wafer. This outer frame defines the regions to be filled by the electro-formed metal. The assembly then undergoes an electro-forming process in which the region between the chips located within a section defined by the outer frame is filled by an electroplated metal such as copper. The frame, regions of electroplated metal and multiple chips are then released from the carrier wafer. The electro-formed metal covers the substrate side of the chips and also covers the other four sides of the chips, thereby embedding the chips within the metal material. The top side or epi-side of the chips is not covered by the electroplated metal. Electrical interconnects can be made to the exposed top side of the chips. Then, the outer frame is removed, by a process such as etching, and the individual assemblies comprising metal-embedded chips are thereby separated. Multiple assemblies can be fabricated on a single carrier wafer, as illustrated in FIG. 2.

For a multi-chip module made using this standard MECA process, the electro-formed metal serves as a heat spreader that conducts heat from the chip to a surface through which that heat is removed, such as the copper surface shown in FIG. 2 that is opposite the surface with the interconnects. The fabricated assembly would be attached to a separate structure that contains the cooling liquid or vapor through this surface, as illustrated in FIG. 1b. All of the embedded chips in a given assembly would share the same surface through which the heat they generate is removed. The heat from a given chip is removed through the substrate of that chip rather than through the top side of the chip. For most chips, the active device (such as a laser or an amplifier) is located near the top side of the chip and away from the opposing substrate side of the chip. Thus, heat generated from the active device must first be conducted through the substrate material of the chip and then through the electro-formed metal, or a metal heat spreader, to the surface from which the heat is then removed. Furthermore, there is another thermal interface between the electro-formed metal surface and the surface of the coolant-containing structure to which it is attached. That interface typically would comprise a film of solder or some thermally conductive adhesive. This further increases the thermal resistance for the heat-removing path to the coolant. Heat is typically not removed through the top side of the chip, since electro-formed metal does not cover that top surface. In some cases, the top side of the chips could be bonded to a thermally conductive substrate that also serves as an electrical interconnect substrate. In such cases, the interconnect substrate would function like the dielectric heat spreader of the flip-chip bonded devices described above.

For the standard MECA, only the top side of a chip is exposed and not covered with the electro-formed metal. Thus, if one of the chips is an optoelectronic chip, light could be coupled to/from that chip only through its top side. But it would not be possible to couple light to/from the other sides of the chip, which are buried within the electro-formed metal. The standard MECA process is compatible only with optoelectronic devices such as vertical cavity surface emitting lasers and surface-coupled photodetectors, light-emitting diodes and optical modulators. However, the standard MECA process is incompatible with edge-coupled or edge-emitting devices such as most distributed feedback lasers, high-power diode lasers, quantum-cascade lasers, semiconductor optical amplifiers, waveguide-coupled photodetectors, edge-coupled photodetectors, and waveguide optical modulators. The edge-coupled or edge-emitting high-power semiconductor optical amplifiers, diode lasers and quantum-cascade lasers, which generate substantial amounts of heat, would benefit the most from direct integration with a heat spreader. Thus, there is a need for a way to integrate such high-power optoelectronic chips with an effective heat spreader such as the electro-formed metal used by the MECA technology for the other opto-electronic devices mentioned above.

For the typical examples of prior art, as described above, all of the chips 12 in an assembly comprising multiple chips 12 are placed with their top side (i.e., the side on which the epitaxial layers are grown and the side at which the active device such as the laser or transistor is located) facing in the same direction, such as facing a common heat spreader piece 14 as shown by FIG. 1a. The heat spreader 14 may comprise an electrically non-conductive (i.e., dielectric) material so that the multiple chips 12 would not be shorted together. Alternatively, all of the chips 12 in an assembly comprising multiple chips are placed with their substrate side facing the same direction (and those chips are embedded through their substrate sides in a common and electrically continuous metal heat spreader piece, with their top sides not being embedded) as shown by FIG. 1b. In either case, the multiple optoelectronic chips of these prior art designs end up with their active devices or regions facing a common direction.

In contrast art, different to this prior optoelectronic chips in an assembly comprising multiple optoelectronic chips of the disclosed photonic module can have their top side facing in opposite directions rather than a common direction. For example, a top side of a first chip may face a substrate side of a second chip (wherein the top side of a chip is opposite the substrate side of that chip). Both of these chips could have those sides that face each other (or are on different optoelectronic chips) abutting a same portion of heat spreader. Alternatively, a first chip could have its top side facing the top side of a second chip and also both of these chips could have their top sides abutting a same portion of heat spreader. Likewise a first chip could have its substrate side facing the substrate side of a second chip and also both of these chips could have their bottom or substrate sides abutting a same portion of heat spreader. These arrangements are not possible with the configurations of chips used in the prior art.

This disclosure relates to embodiments of a photonic module 10 that integrates one or more optoelectronic chips 12, such as laser diode chips, with regions of a metal heat spreader 14. These heat spreader regions are preferably formed by electroforming a metal, such as copper, directly onto two opposing sides of an optoelectronic chip 12. The electro-formed metal regions formed onto two opposing sides of an optoelectronic chip 12, are preferably electrically separate so that they can also serve as electrical current conducting paths for providing current to drive the optoelectronic chip 12, such as to drive a laser diode, to thereby produce emission of laser light. Prior art optoelectronic chips may have one of their electrical contacts attached to the chip by electroforming a metal onto the chip, but not more than one such electrical contact. Thus, prior art optoelectronic chips need to also use a separate bonding step (involving high temperature and/or high pressure) to attach the chip to a heat spreader and/or to form a second electrical interconnection. At least one other side of the optoelectronic chip has at least a portion of that other side free of any electro-formed metal abutting that other side. Light can be coupled into or out from that other side since it is not obstructed by metal.

In some embodiments, at least one of these electro-formed metal regions also defines at least a portion of a chamber capable of containing a coolant fluid (liquid, vapor or two-phase). A fluid wicking structure may be attached to an electro-formed metal region to provide capillary transport of the coolant liquid to the electro-formed heat spreader region. This allows the heat spreader for each optoelectronic chip to function as a vapor chamber or heat pipe, which can have much higher effective thermal conductivity than a solid material (e.g., metal or diamond).

In some embodiments, a portion of an electro-formed metal provides a surface for reflection of light coupled to/from the optoelectronic chip. Such a reflective surface 14s, 14 may act as a reflective lens or a diffractive grating, for example. In some embodiments, a portion of the electro-formed metal region secures in place an additional optical element 14$_M$ such as a refractive or diffractive lens piece, a partially reflective mirror or optical coupler piece, a spatial light modulator piece, a diffractive grating piece, or an optical aperture, for example. This allows the electro-formed metal to fix the locations of the optoelectronic chips 12 as well as the other optical elements used therewith, so that precise optical alignments can be maintained during manufacture.

The disclosed photonic module 10 may have a dielectric cap 16 that is attached to both of two otherwise separate electro-formed metal regions of the photonic module 10 to provide structural support, thus reducing stress that otherwise might be applied to the optoelectronic chip 12. In some embodiments, the disclosed photonic module 10 also has a dielectric spacer 14D abutting two otherwise separate electro-formed metal regions of the heat spreader 14 to keep those metal regions electrically isolated, but mechanically connected for additional structural strength. In some embodiments, the disclosed photonic module 10 can also have cover pieces and lids 20, 22 & 24 that are attached to separate electro-formed metal regions to provide structural support. The dielectric cap 16, covers 22 and 24 and lids 20, in combination with the electro-formed heat spreader metal regions 14 to which those various pieces are attached, can also define the fluid chambers or compartments 14c for containing a coolant fluid 26C/vapor 26V. The fluid chambers or compartments 14c may define a single unitary chamber for cooling all optoelectronic chips 12. Alternatively, a photonic module 10 may comprise two or more chambers or compartments 14c for cooling the optoelectronic chips 12, with each chamber or compartment 14c cooling at least one optoelectronic chip 12.

This document also discusses a process for fabricating the photonic module. This process includes placing on a carrier substrate some optoelectronic chips, some mold pieces for defining reflector shapes and locations, pieces comprising additional optical elements, dielectric spacers, pieces with a wick structure, and plating-block pieces, together with a frame for defining areas that are not plated. Any gaps or spaces between abutting pieces in which electro-formed metal is not wanted can be filled with a mask material such as a photoresist. After a plating seed or membrane layer is deposited, areas above that membrane layer in which plated metal is not wanted can be masked with a photoresist or other material that prevents the electro-plating. The heat spreader regions are then formed by electro-plating of a metal such as copper. The plating mask, membrane and gap filler are then removed. The carrier substrate and the mold pieces and frame are released, leaving individual modules that include one or more optoelectronic chips, electro-formed metal heat spreader regions, wick structures, dielec- tric spacers, and optical elements. One or more cap pieces, covers and lids can be attached to the metal heat spreader regions to provide additional structural support and fluid/vapor containment integrity for the module.

The disclosed photonic module could be, for example, utilized as a laser transmitter that produces a high-power beam of light. The features of the disclosed module enable the optoelectronic chip (e.g., laser gain element) of the module to be operated at a lower temperature than achievable previously. Since the electrical-to-optical conversion efficiency of a laser chip typically is improved by operating at a lower temperature, the laser module can have better efficiency.

The disclosed photonic module minimizes the thermal interfaces and thus the thermal resistance between an opto- electronic chip, whose generated heat must be removed, and a coolant fluid or vapor. The interface between the outer metal surface of the chip and the coolant fluid or vapor can comprise as little as a layer of adhesive metal (such as titanium of thickness between 5 and 20 nm), a layer of diffusion-barrier metal (such as platinum or nickel of thickness between 5 and 50 nm), an optional layer of electro-plating seed metal (such as gold or copper of thickness between 5 and 200 nm), and a region of the metal heat spreader (such as copper or gold or nickel-covered gold of thickness between 100 and 1000 μm). Since the coolant fluid or vapor can be brought in close proximity to the optoelectronic chip to be cooled, the thermal resistance and capacitance of the structure can be reduced and thus reduce the time constant for bringing the chip to a thermal steady state. The disclosed photonic module can have a thermal resistance and capacitance whose product is more than an order of magnitude smaller than that of state-of-art modules, and thus the transient response of the module is correspondingly better.

The optoelectronic chips and optical elements in the disclosed photonic modules can have their relative spatial locations and positions fixed with high accuracy, thereby achieving accurate alignment of those parts. The placement accuracy is determined by what a chip, die or flip-chip bonder can achieve, which can be better than +0.3 μm. By achieving such accurate alignment without needing to actively operate the optoelectronic chip during the module assembly process (i.e., without using an active alignment method), the overall cost of fabricating the photonic module can be reduced.

The disclosed process also provides a method to attach a metal heat spreader (the electro-formed metal region) to an optoelectronic chip without needing to increase the temperature of the optoelectronic chip beyond 120 degrees Celsius. This method also greatly reduces the thermal and mechanical stress applied to and experienced by the chip, such as during a die-bonding process. The electro-formed metal region typically comprises a material having high thermal conductivity and high electrical conductivity, such as copper. The electro-formed metal region also can be a part of a vapor chamber or heat pipe, with vapor chambers typically having even higher thermal conductance than diamond. Previous methods for attaching an optoelectronic chip to a heat spreader (such as diamond or copper) that has high thermal conductivity involve using a high temperature solder or a high temperature thermo-compression bonding process, which increase the thermal stress experienced by the optoelectronic chip. Thus, the disclosed photonic module can have better reliability, which often is affected by the thermal and mechanical stress associated with the fabrication and assembly processes.

BRIEF DESCRIPTION OF THE DRAWINGS

FIG. 3(a) presents a top view thereof and FIGS. 3(b)-3(c) are cross-sectional views taken along lines 3(b)-3(b) and 3(c)-3(c), respectively, of FIGS. 3(a) and 3(d) is cross-sectional view taken along and line 3(d)-3(d) of FIG. 3(c). FIG. 3(c-1) depicts an enlarged portion of FIG. 3(c).

FIG. 4(a) presents a cross sectional top view thereof (taken along line 4(a)-4(a) shown in FIG. 4(c)) and FIGS. 4(b) and 4(c) are cross-sectional views taken along lines 4(b)-4(b) and 4(c)-4(c), respectively, of FIG. 4(a).

DETAILED DESCRIPTION

The following description is presented to enable one of ordinary skill in the art to make and use the teachings of this presentation and to incorporate them in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of embodiments of this presentation. However, it will be apparent to one skilled in the art that such embodiments may be practiced without necessarily being limited to these specific details.

All the features disclosed in this presentation, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Figures 1A, 1B:
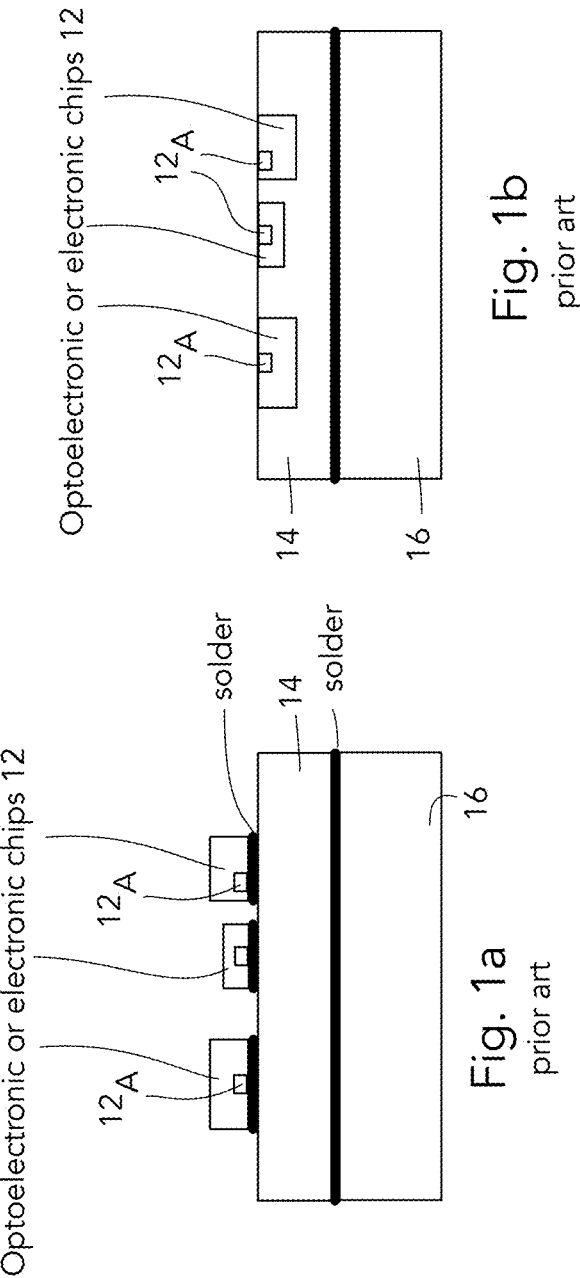
FIG. 1a depicts a prior art assembly of heat-generating chips and heat spreaders where the chips are bonded epi-side down onto a common dielectric heat spreader.
FIG. 1b depicts a prior art assembly of heat-generating chips and heat spreaders where the chips are embedded in an electro-formed metal heat spreader.
Figure 2:
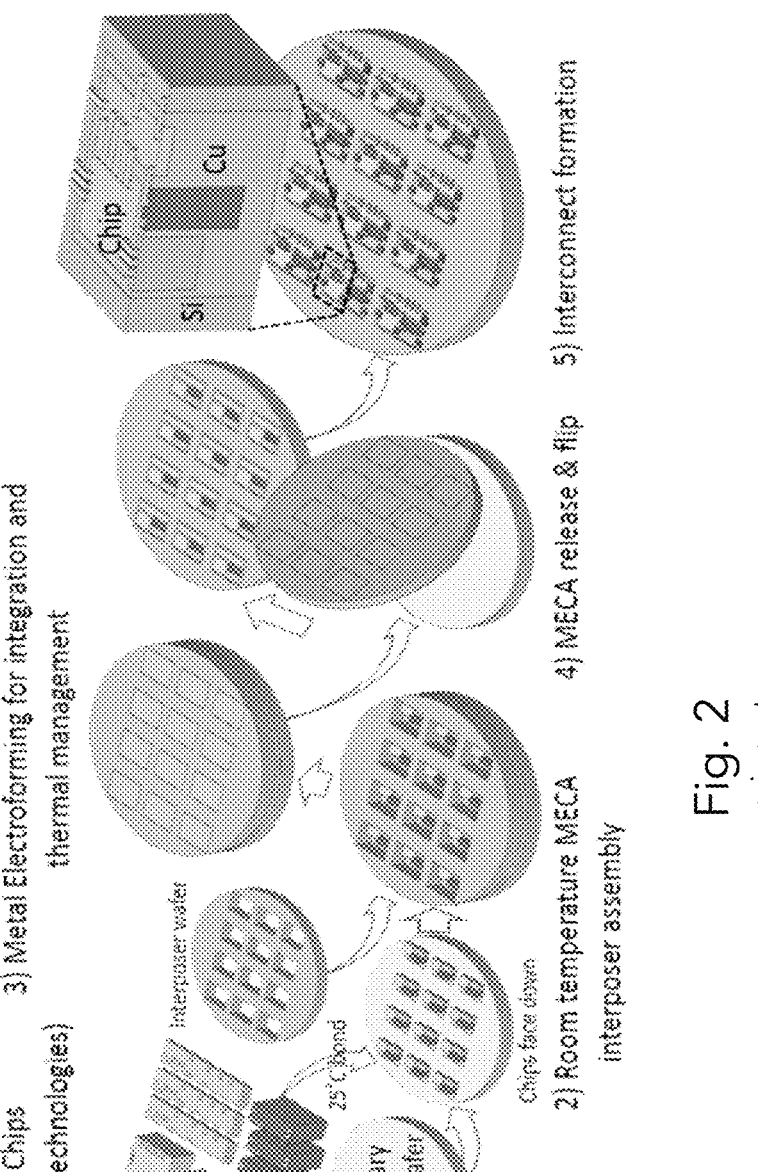
FIG. 2 is a drawing depicting a metal-embedded chip assembly (MECA) process.
Figures 3A, 3B:
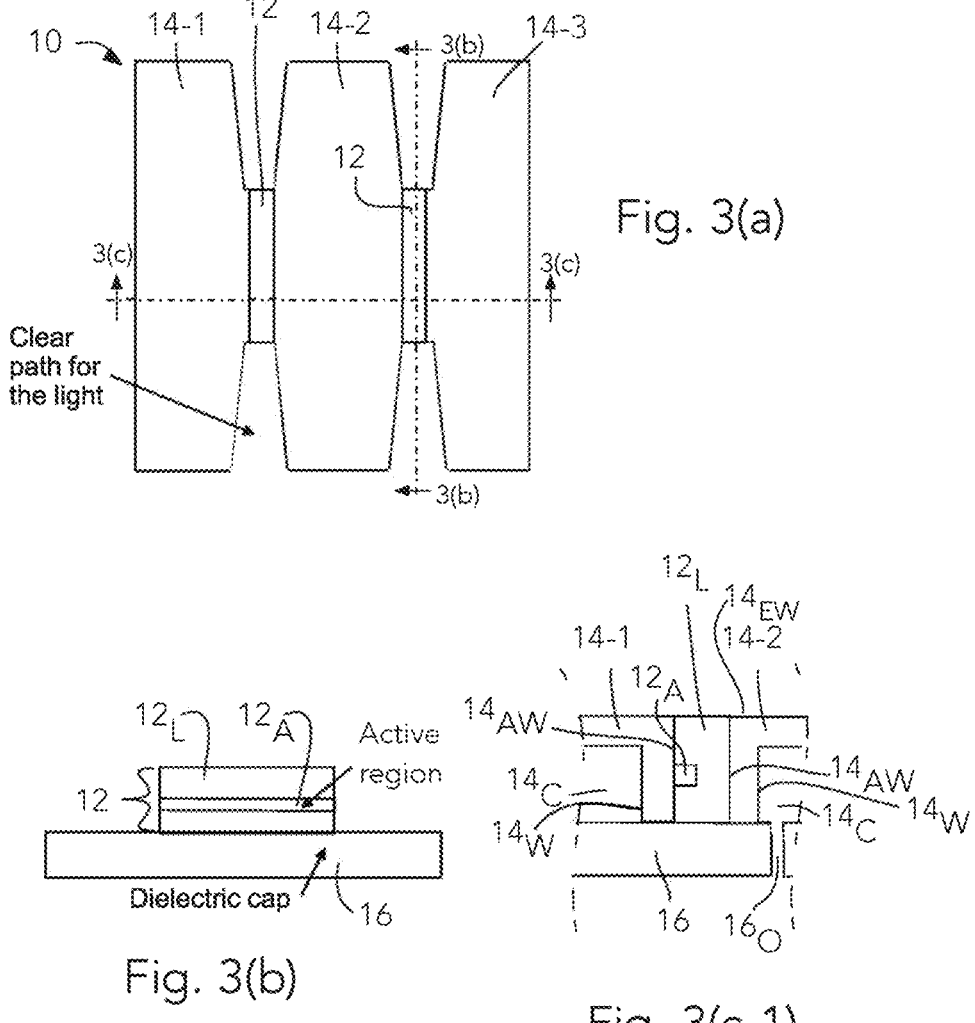
FIGS. 3(a)-3(d) are illustrations of an embodiment of a photonic module of the present disclosure having two optoelectronic chips and electro-formed metal heat spreader regions where

FIG. 3(a) shows a top view of an embodiment of photonic module 10 comprising two opto-electronic devices (laser devices or chips, for example) 12 that are each sandwiched between regions 14-1 and 14-3 of a heat spreader 14 (preferably made of a good heat and electrically conductive material such as copper and preferably formed by electroplating). The opto-electronic devices 12 may comprise a six-sided block of semiconductor material embodying a laser diode having an active region $12_A$. Two sides of the left-most device 12 abut regions 14-1 and 14-2 of heat spreader 14 (for supplying electrical energy to the laser diode or active region 12, in that device 12) while two sides of the right-most device 12 abut regions 14-2 and 14-3 of copper heat spreader 14 (for supplying electrical energy to the laser diode or active region 12, in that device 12). The embodiment of photonic module 10 depicted by FIG. 3(a) has two opto-electronic devices 12, but it should be understood that this embodiment need not be limited to just two devices 12 since the pattern of devices 12 and the heat spreader regions can easily be repeated to accommodate additional devices 12 using a heat spreader 14 having additional heat spreader regions.

FIG. 3(b) provides a cross-sectional view of the embodiment of the photonic module 10 of FIG. 3(a) as viewed through a reference (dashed section) line 3(b)-3(b) indicated on FIG. 3(a). This reference line follows the longitudinal laser axis of an active region $12_A$, of an opto-electronic chip or device $12_L$ of each device 12. The "L" subscript denotes that the opto-electronic chip or device 12 preferably is a laser device or has a laser device imbedded in it, the opto-electronic chip or device $12_L$ having an active (light emitting) region labeled $12_A$ (see FIG. 3(b) in or associated with it). The opto-electronic chip or device 12L may comprise or include a laser diode or an optical amplifier or optical modulator. The two (longitudinal) ends (sides) of the opto-electronic chip $12_L$ are, in general, not (completely) covered by heat spreader 14 and instead are (at least partially) exposed. It is intended that light emitted from one end or from both ends of active region $12_A$ of the opto-electronic chip $12_L$ can propagate in an unobstructed fashion. Light is emitted mainly from the active region $12_A$ (the laser, for example) at one or both of the two ends of the chip $12_L$. Thus, if a portion of an end from which light is emitted is covered by the heat spreader, preferably without covering the active region $12_A$, that may be an acceptable design alternative compared to leaving the ends completely uncovered by the heat spreader 14.

Figure 3C:
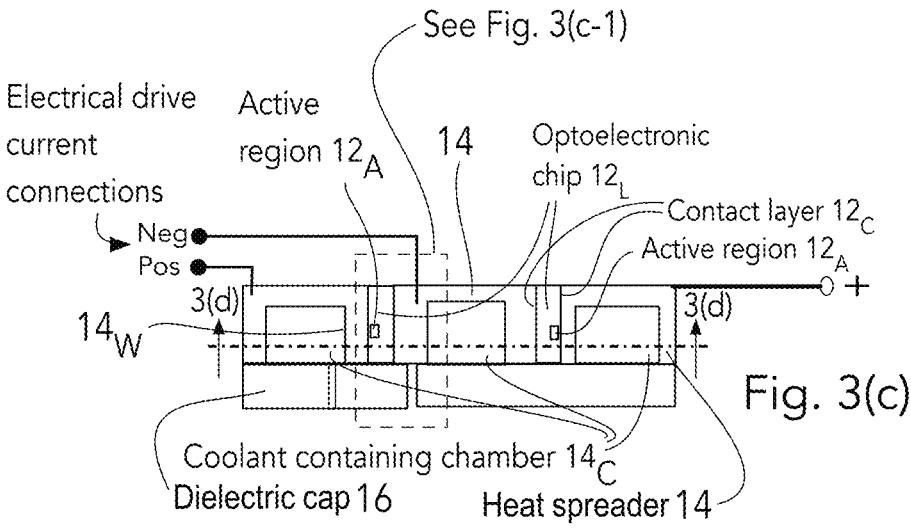

Each chip $12_L$ is preferably sandwiched by regions 14-1 and 14-2 or regions 14-2 and 14-3 (or sandwiched with still more regions if the module 10 has additional opto-electronic chips $12_L$) and is bounded on the far sides thereof (from the perspective of FIG. 3(a)) by a dielectric cap 16 seen in FIGS. 3(b) and 3(c) for example.

Figure 3D:
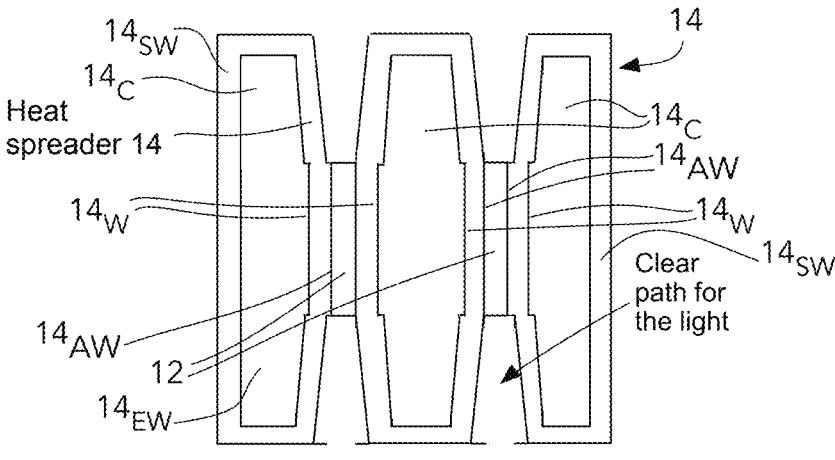

FIG. 3(c) shows a cross-section of the photonic module 10 as viewed through reference (dashed section) line 3(c)-3(c) indicated on FIG. 3(a). FIG. 3(c-1) depicts an enlarged portion of FIG. 3(c). The 3(c)-3(c) reference line cuts transversely through the opto-electronic chips or devices $12_L$. The chip or device $12_L$ at the left (the left most device $12_L$ of FIG. 3(c)) has its epi-layers located at the left-hand side of that device 12 whereas the chip or device $12_L$ at the right (the right most device $12_L$ of FIG. 3(c)) has its epi-layers located at the right-hand side of that chip or device $12_L$. The active regions $12_A$ of each chip of device also are indicated. The active region $12_A$ of a chip $12_L$ can be constructed from its epi-layers. Only the leftmost device $12_L$ is depicted in the enlarged view of FIG. 3(c-1). The heat spreader regions 14 on the far left and right hand sides each have an abutting sidewall surface $14_{Aw}$ that abuts the laser chip $12_L$, a side-wall surface $14_w$ immediately opposite the abutting sidewall surface $14_{Aw}$, an end-wall portion $14_{Ew}$ that is electrically and thermally connected to the sidewall defined by surfaces $14_w$ and $14_{Aw}$ (adjacent chip $12_L$), and a sidewall $14_{sw}$ remote from a chip $12_L$. Each heat spreader region 14 sandwiched between the heat spreader regions on the far left and right hand sides has a pair of abutting sidewall surface $14_{Aw}$ that each abut a separate laser chip $12_L$, a side-wall surface $14w$ immediately opposite the abutting sidewall surface $14_{Aw}$, and an end-wall portion $14_{Ew}$ that is electrically and thermally connected to the sidewalls defined by surfaces $14_w$ and $14_{Aw}$ (adjacent devices $12_L$). In FIG. 3(c) only a single heat spreader region 14 is shown sandwiched between two devices $12_L$, it being understood that if photonic module 10 has more than the two laser devices $12_L$ illustrated, then multiple heat spreader regions 14 would then be sandwiched between adjacent devices $12_L$ and each of same would appear like the single sandwiched heat spreader region 14 of FIG. 3(c). Consider briefly the embodiment of FIGS. 4(a)-4(c). In FIG. 4(c), the end-wall $14_{Ew}$ of FIG. 3(c) is replaced by an end cover 24. If this end cover 24 is made of a dielectric material, it allows the two portions of heat spreader 14 disposed on either side of an optoelectronic chip 12 and joined by that end cover 24 to be electrically isolated from each other.

Considering FIG. 3(c) once more, one possible embodiment of the electrical connections to the devices 12 is shown in that figure. In this embodiment, a negative terminal is coupled to the center-most heat spreader region (see the legend "Neg.") while positive terminals are coupled to the outer-most heat spreader regions (see the legends "Pos.").

Figure 3E:
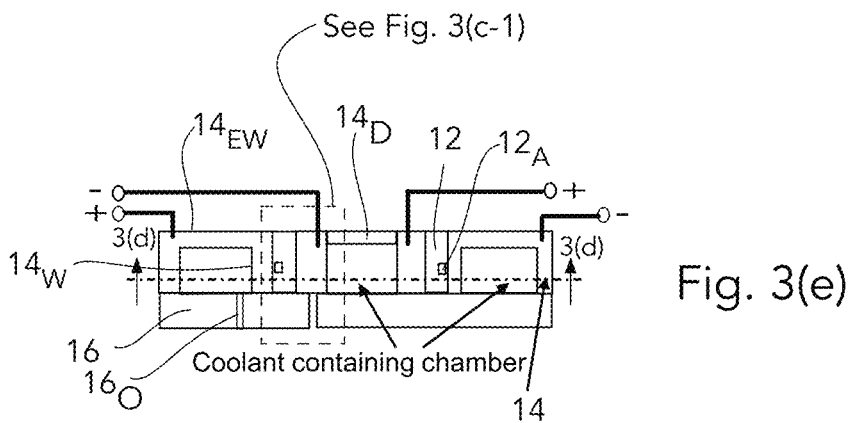
FIGS. 3(e) and 3(f) depict another embodiment where the center-most heat spreader region may be connected to two different (positive and negative, for example) electrical potentials.
Figure 3F:
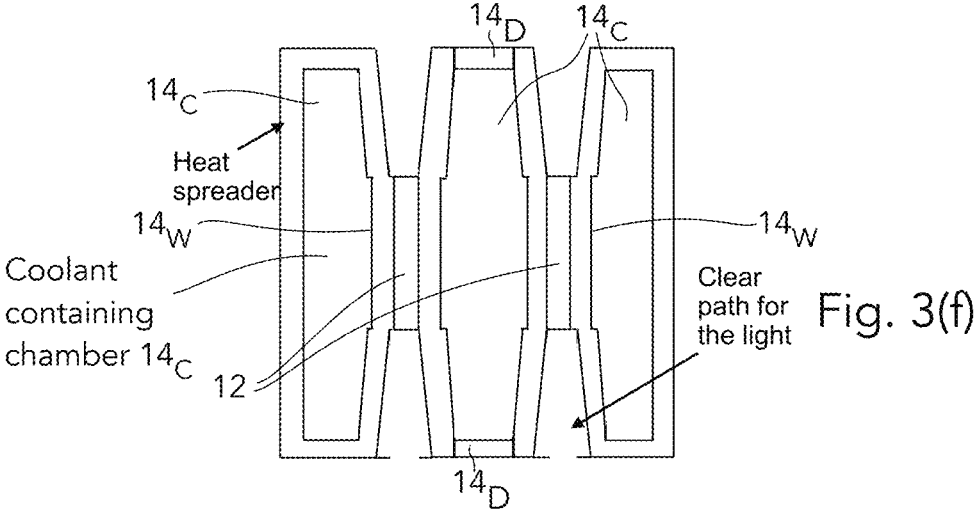

FIGS. 3(e) and 3(f) depict another embodiment where the center-most heat spreader region may be connected to two different (positive and negative, for example) electrical potentials.

In the embodiment of FIG. 3(c) the module 10 has three cooling channels or coolant containing chambers $14_C$ that are preferably in fluid communication with each other and have channels for communicating that fluid externally of the photonic module 10. These chambers $14_C$ will be discussed in greater detail with respect to FIG. 3(d) where together they form a unitary cooling chamber.

FIG. 3(d) shows a cross-sectional bottom view of the photonic module 10 as observed through dashed line 3(d)-3(d) indicated on FIG. 3(c). The sidewall $14_W$ of a heat spreader region 14 that is opposite the side $14_{AW}$ (which faces and is attached to an optoelectronic chip 12) can be formed to have a pattern of grooves, fins, channels, nozzles and/or chambers (not shown in this figure) facing chamber $14_C$. These structures can facilitate the flow of a coolant fluid and improve the transfer of heat from the heat spreader to a coolant fluid in chambers $14_C$. As illustrated in FIGS. 3(c) and 3(d), each heat spreader region 14 preferably includes a chamber 14c with its side walls $14_{SW}$ (also the sidewalls between surfaces $14_W$ and $14_{AW}$) and end walls $14_{EW}$. The end of the chamber opposite the end-wall $14_{EW}$ is covered, at least partially, with a dielectric cap piece 16 or multiple cap pieces 16. In this embodiment, each cap piece 16 extends over the two heat spreader regions 14 that abut a given laser chip 12 and preferably comprises an electrically non-conductive (or electrically insulating or dielectric) material in order to maintain ohmic isolation between adjacent heat spreader regions 14 (which are preferably formed of copper as is mentioned above). The cap piece(s) 16 also serve to mechanically couple and support the two heat spreader regions 14 that abut a given laser chip 12.

Turning to FIGS. 3(e) and 3(f) these figures depict an additional embodiment having dielectric spacer pieces 14D disposed between the two heat spreader regions 14. These dielectric spacer pieces 14D also mechanically couple the two heat spreader regions 14 together and also allow the center-most heat spreader region 14 to be split, electrical conduction-wise, so that the immediately adjacent conductive surfaces of the left most and right most laser chips 12 can be supplied with different electrical potentials.

The cap piece 16, in combination with the side walls and end wall of a heat spreader region 14, define a chamber 14c that can contain a coolant fluid $26_c$ or vapor $26_v$. One or more openings $16_O$ may be formed in or by the cap piece(s) 16. The coolant fluid $26_c$ or vapor $26_v$ could flow through these openings $16_O$ to/from the chamber(s) 14c.

The laser chip is operated by flowing electrical current through the two heat spreader regions abutting that laser chip and through the two contact layers $12_C$ on opposing sides of the laser chip 12 (see FIG. 3c). Thus, the laser chip is oriented with the side of the chip that is typically considered its top side (or epi-layer side) abutting one of the heat spreader regions and with the side of the chip typically considered it bottom side (or substrate side) abutting another heat spreader region. One of the short sides of the laser chip preferably faces the dielectric cap piece. The other short side of the laser chip is preferably not covered by any metal heat spreader material.

Figure 4A:
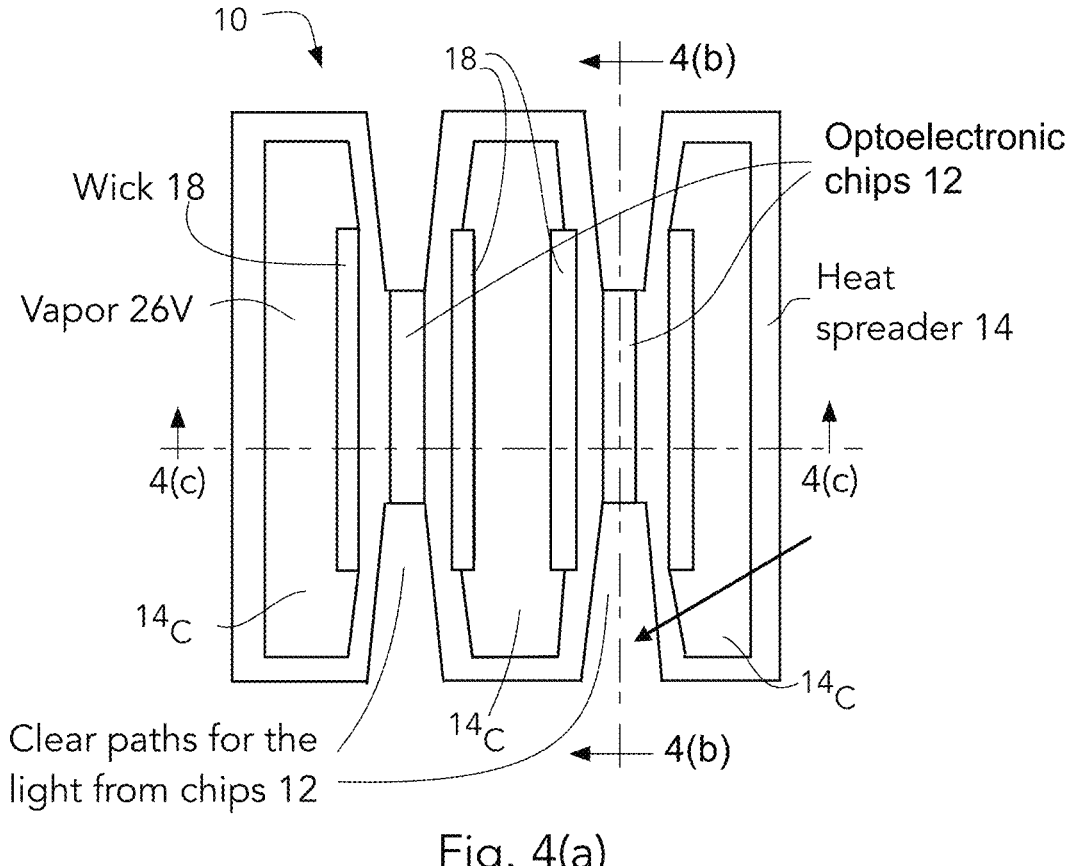
FIGS. 4(a)-4(c) illustrate another embodiment of a photonic module, this embodiment containing two optoelectronic chips, electro-formed metal heat spreader regions and wicked vapor chamber/heat pipe compartments where

FIG. 4(a) shows a cross-sectional top view of another embodiment of the photonic module 10. This module has a wicking structure 18 located in the chamber compartments 14c defined by the heat spreaders 14 on each side of a laser chip 12. One of the wicking structures 18 is attached to an internal surface of the electro-formed metal (e.g., copper) of the heat spreaders 14 where it faces an opto-electronic or laser device 12. The wicking structure 18 may have various constructions. The wicking structure 18 may comprise, for example, a porous metal foam, a metal mesh, sintered metal powder, or possibly a set of grooves formed in a metal surface (a porous copper foam material being preferred). Coolant can flow through the small pores, paths, or grooves in the metal wick assisted by capillary action. Also, heat can be conducted through the metal regions of the wick 18 to the coolant in the openings of the wick and in chambers 14c.

Figure 4B:
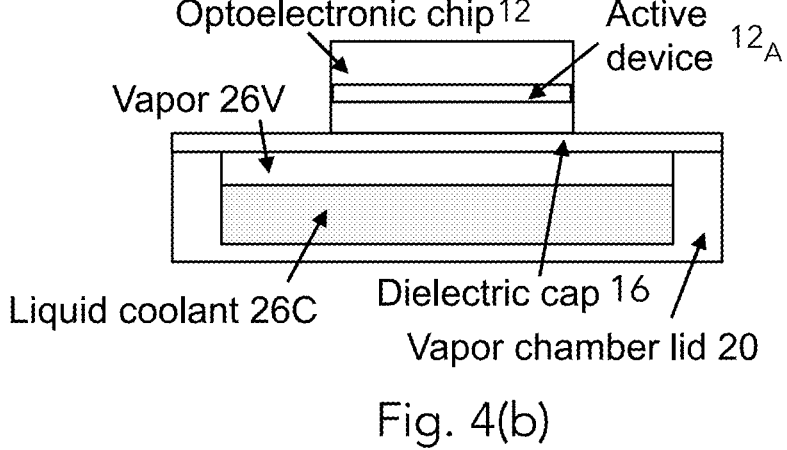
Figure 4C:
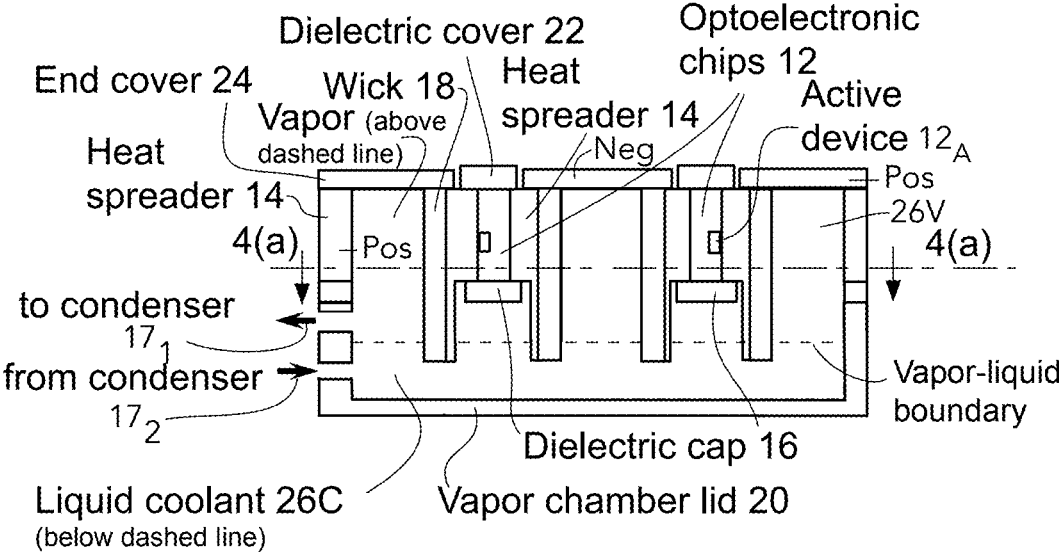

FIG. 4(b) shows a cross-section view of this embodiment of a photonic module 10 as viewed through reference (dashed section) line 4(b)-4(b) indicated on FIG. 4(a). FIG. 4(c) shows a cross-section view of this photonic module as viewed through reference line 4(c)-4(c) indicated in FIG. 4(a). FIG. 4(a) is a cross sectional view of the module 10 as viewed through reference line 4(a)-4(a) indicated in FIG. 4(c). Note that the combination of the electro-formed copper in the heat spreader 14 walls and the copper in the wick 18, (assuming that a copper foam embodies the wicks 18), provide a path for conducting heat to the fluid in the pores of the foam of wick 18. The foam of wick 18 provides an effective means to supply coolant fluid to the copper regions of wick 18. One or more sides of the wick 18 is attached to a wall of the copper heat spreader 14. Evaporated coolant (in its vapor phase) may be formed at the side of the wick 18 opposite the side facing the electro-formed heat spreader 14 and facing the opto-electronic or laser chip $12_L$ generating the heat. Such evaporative cooling can be an efficient way to maintain the temperature of the laser chip at a desired value. At least one or more of the other sides of the piece of copper foam defining wick 18 are not covered or attached to the copper heat spreader 14. At least a portion of the un-attached sides of the copper foam defining wick 18 is preferably exposed to the vapor phase of the fluid in the chamber compartment $14_C$, which in some embodiments is defined by the heat spreader structure and the cap, cover and lid pieces.

The embodiment illustrated by FIG. 4(c) has a first path $17_1$ for transport of the vapor (the evaporated coolant) to a condenser (which is not shown in the figure) that is separate, in this embodiment, from the photonic module 10 with the wicks 18 and heat spreaders 14, and a second path $17_2$ for transport of the (cooled) liquid-phase coolant from the condenser back to the photonic module 10. However, other configurations for evaporative cooling could additionally or alternatively be used in the photonic module 10. For example, the condenser could be integrated with the vapor chamber structure $14_C$ instead of being located at a distance from that structure (see, for example, FIG. 6(j)). A heat exchanger (for example, to flowing air) or heat sink could then be attached to the integral condenser.

Figure 5A:
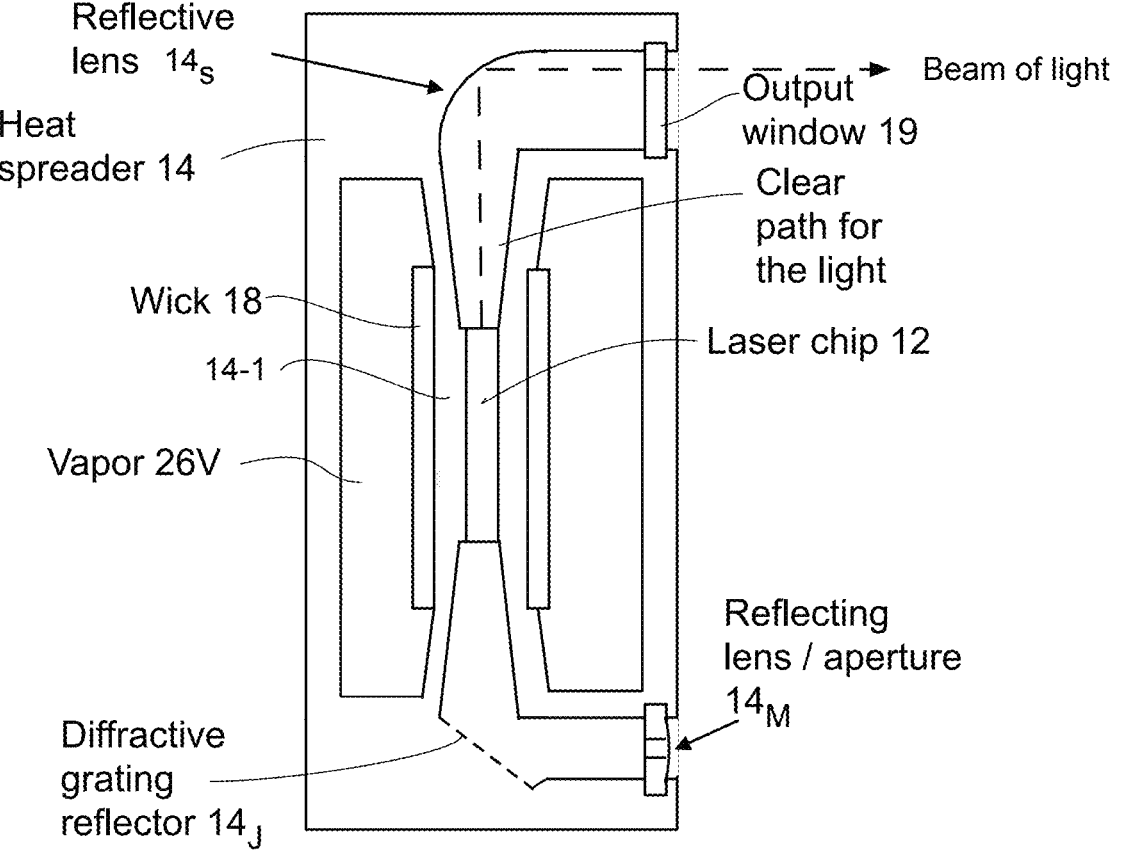
FIGS. 5(a) and 5(b) illustrate yet another embodiment of a photonic module with an optoelectronic laser chip and additional optical elements, with FIG. 5(a) presenting a cross-sectional top view of completed module, and FIG. 5(b) presenting a cross-section top view of a partially completed module.

FIG. 5(a) provides a cross-sectional top view of yet another embodiment of a photonic module 10 that comprises a laser chip 12 and additional optical elements. Some of these optical elements may comprise surfaces formed as part of a material, preferably electro-formed copper, and other optical elements may comprise separate elements that are secured in place by the aforementioned electro-formed copper. As depicted in FIG. 5(a), a first portion 14-1 of the copper heat spreader region 14 abutting the left side of the laser chip 12 has a nearby surface $14_s$ that has a curved shape. This curved surface $14_s$ acts as a reflective lens for the beam of laser light emitted by laser chip 12 toward that surface. For example, the curvature of the surface may be designed to collimate the beam of light from laser chip 12. As another example, the curved surface $14_s$ may serve to focus and direct the beam of light from laser chip 12 onto an output aperture or window 19, to pass through that window. Another portion of the first portion 14-1 of the heat spreader region 14 abutting the left side of the laser chip 12 has a surface that has a jagged or saw-tooth shape $14_J$. This surface $14_J$ acts as a diffractive grating for the beam of laser light emitted toward that surface. For example, the grating 14j may reflect a specific range of wavelengths of light back toward the laser chip 12, as in a Littrow configuration for a blazed grating where the blaze angle is chosen such that diffraction angle and incidence angle are identical, meaning that the diffracted beam is back-reflected into the direction of the incident beam. Such grating configurations are often used to select a de sired wavelength for the light emitted by the laser chip 12. As another example, the grating 14$_J$ could direct a specific range of wavelengths toward a separate reflecting or partially reflecting mirror piece 14$_M$. The mirror piece could have a region that is reflective and another region that is non-reflective or even that is absorbing. The portion of light reflected from the reflective region of the mirror piece 14M is coupled back, again through the diffractive grating 14$_J$, to the laser chip. This Littman-Metcalf configuration also is often used to select a desired wavelength for the light emitted by the laser chip 12. The mirror piece 14M may have a curved surface and also act as a lens, if desired. For example, if the mirror piece 14M is embodied with a lens, the lens could be designed to focus the reflected light onto the active region of the laser chip 12.

Figure 5B:
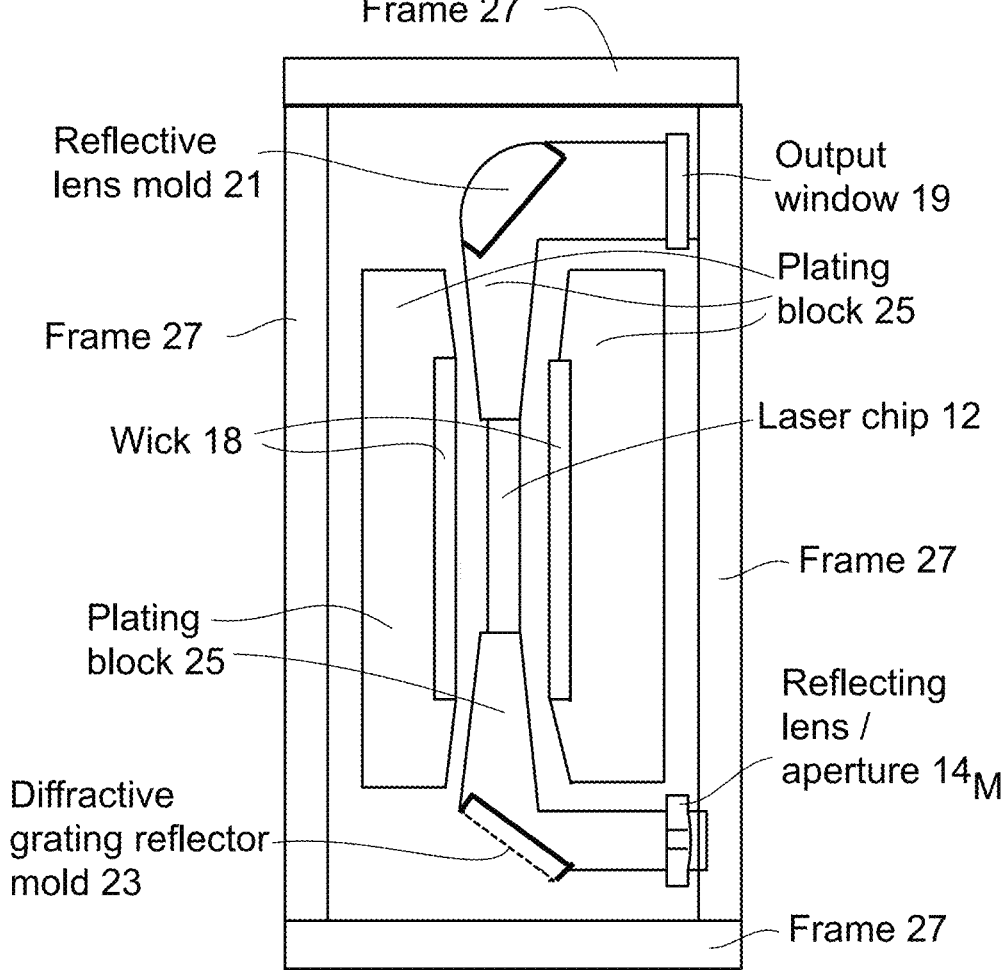

FIG. 5(b) presents a top view of a partially fabricated version of the photonic module 10 of FIG. 5(a). This figure shows the module 10 before the electro-formed metal regions have been made. Shown in FIG. 5(b) are an optoelectronic chip 12, a mold piece 21 that defines a reflective lens 14$_S$, a mold piece 23 that defines a diffractive grating reflector 14$_J$, an optical element that is an output window 19, an optical element 14$_M$ that is a reflective lens/aperture, several wicking structures 18, several plating blocks 25, and a frame 27. These parts define the regions that will be electro-plated to form the regions of metal heat spreader 14. The mold pieces 21, 23, plating blocks 25 and frame 27 are formed of a sacrificial material, such as a wax or Si or other suitable material, which is removed after the regions of metal heat spreader 14 are formed. The heat spreader 14 regions are formed only in the larger spaces between the parts. In general, the parts are arranged and are designed such that small voids or gaps between the surfaces of adjacent parts should not be occupied by the electro-plated or electro-formed metal of the heat spreader 14. After the metal heat-spreader 14 regions are electro-formed, the mold pieces 21 and 23, the plating blocks 25 and the frame 27 are detached from the resulting assembly which defines this embodiment of photonic module 10 which is shown in FIG. 5(a). The assembly includes the metal heat-spreader regions 14, the optoelectronic or laser chip 12, the optical element that is an output window 19, the optical element that is a reflective lens/aperture 14$_M$, and the wicking structures 18. A cap piece is located at the bottom side of the structure and is not shown in this top view.

FIGS. 6(a)-6(j) illustrate the main steps in a process for fabricating an embodiment of photonic module 10. FIGS. 6(a)-6(j) are intended to demonstrate possible construction techniques which may used, with suitable modifications to shapes and placement of various components, to make a photonic module 10 identical or similar to those discussed with reference to the preceding figures.

Figures 6A, 6B:
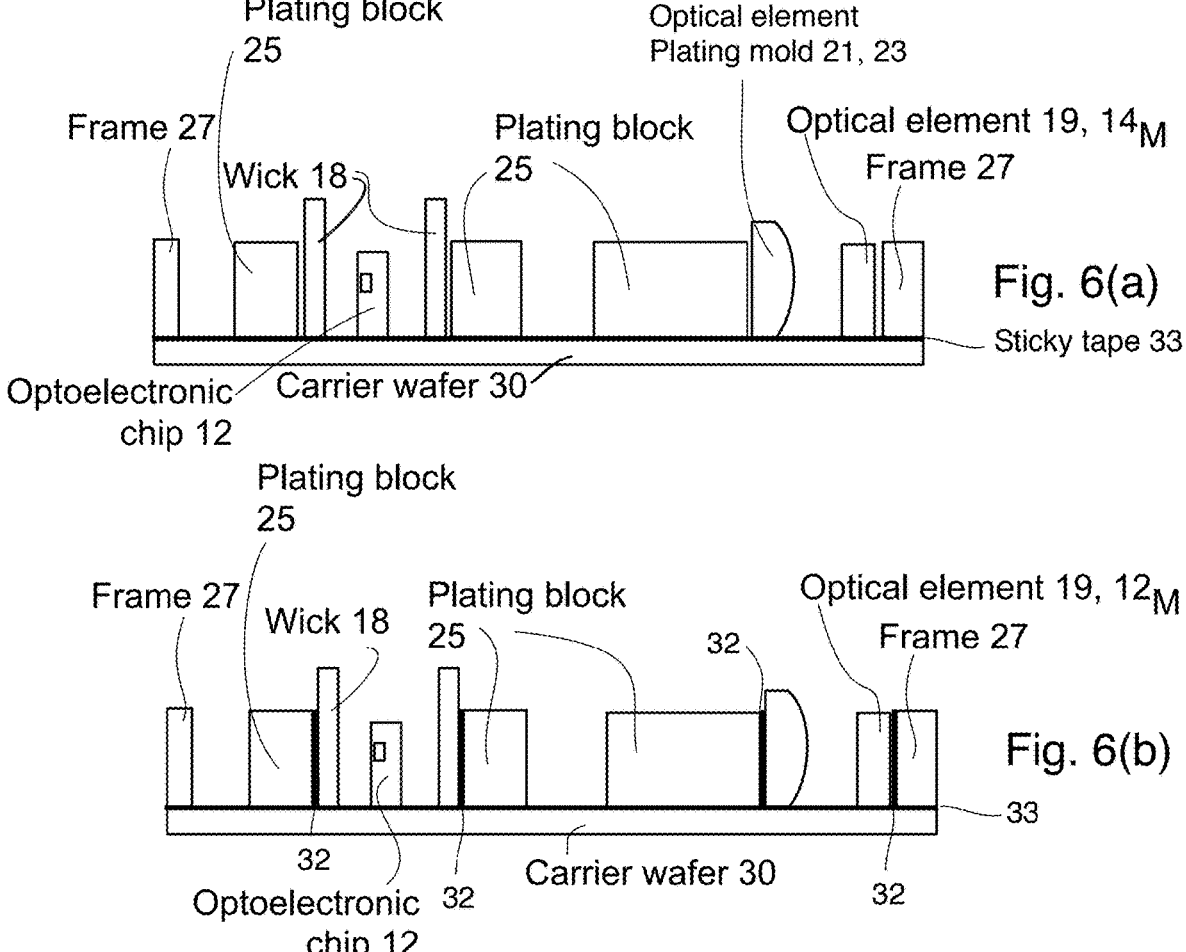
FIGS. 6(a)-6(j) depict an embodiment of a process for fabricating a photonic module.
Figure 6C:
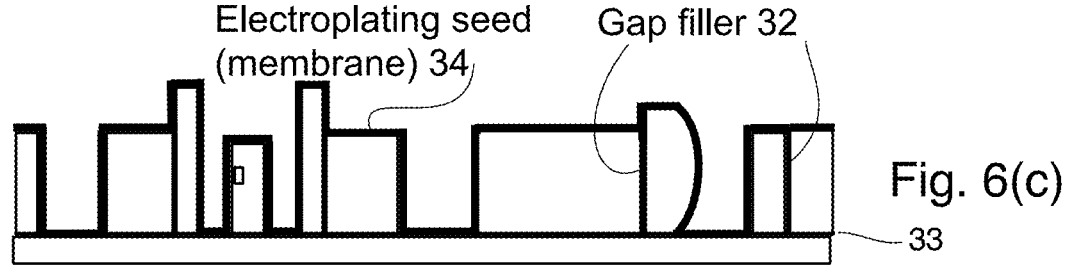

First the various pieces or parts or chips that define a module 10 are placed on a carrier wafer 30 and are temporarily secured to that carrier wafer using, for example, a doubled-sided sticky tape or film 33. (see FIG. 6(a)). These parts could be the ones shown in FIG. 5(b), for example. Small gaps between adjacent parts are preferably filled with a removable material 32 such as a polymer, photoresist or wax, as is depicted by FIG. 6(b). Then (see FIG. 6(c)), an electro-plating seed or membrane layer 34 is deposited over the wafer. This membrane layer covers the exposed sides and surfaces of the various parts, such as the exposed sides of the optoelectronic chip 12.

Figure 6D:
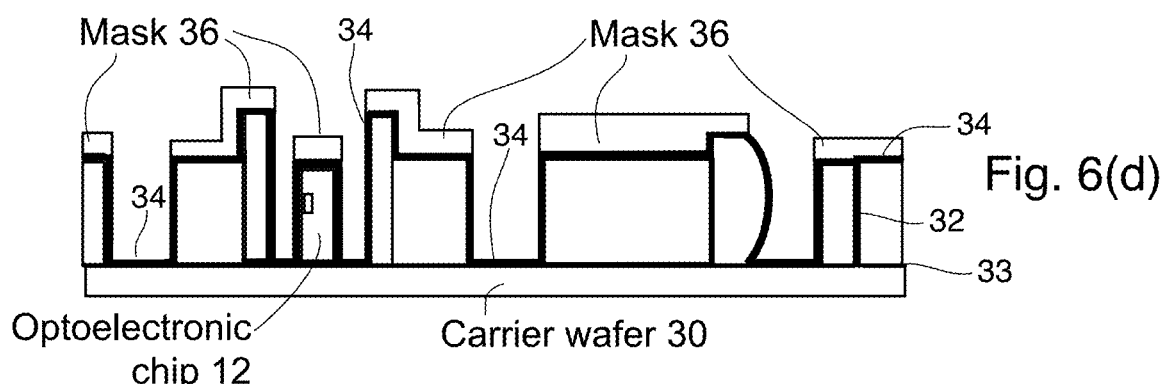
Figure 6E:
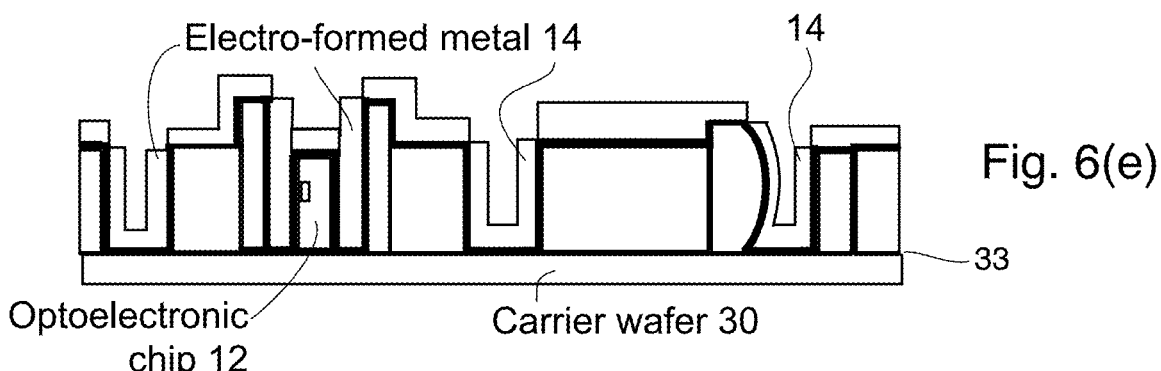

Next (see FIG. 6(d)), a layer 36 of masking material is deposited over the wafer and is patterned to define regions that will be electroplated (where the mask material 36 is not present or is removed) and regions that will not be electroplated (where the mask material 36 remains after patterning). The metal heat-spreader regions 14 are then electroformed (see FIG. 6(e)) by an electroplating process. The electroplated metal regions (forming the heat spreader 14) could cover the sides of the chips and pieces that are exposed to the electroplating solution. The metal regions also cover exposed areas of the carrier wafer. Depending on a particular use, the thickness of the electro-formed metal 14 could range from 0.05 mm to 1 mm or perhaps more than 10 mm. The thickness of the electro-formed metal 14 may be approximately uniform, so that in some places the electro-formed metal 14 takes a U-like shape. See, for example, the electro-formed metal 14 near the left-hand and right-hand edges of the depicted embodiment of photonic module 10.

Figures 6F, 6G, 6H:
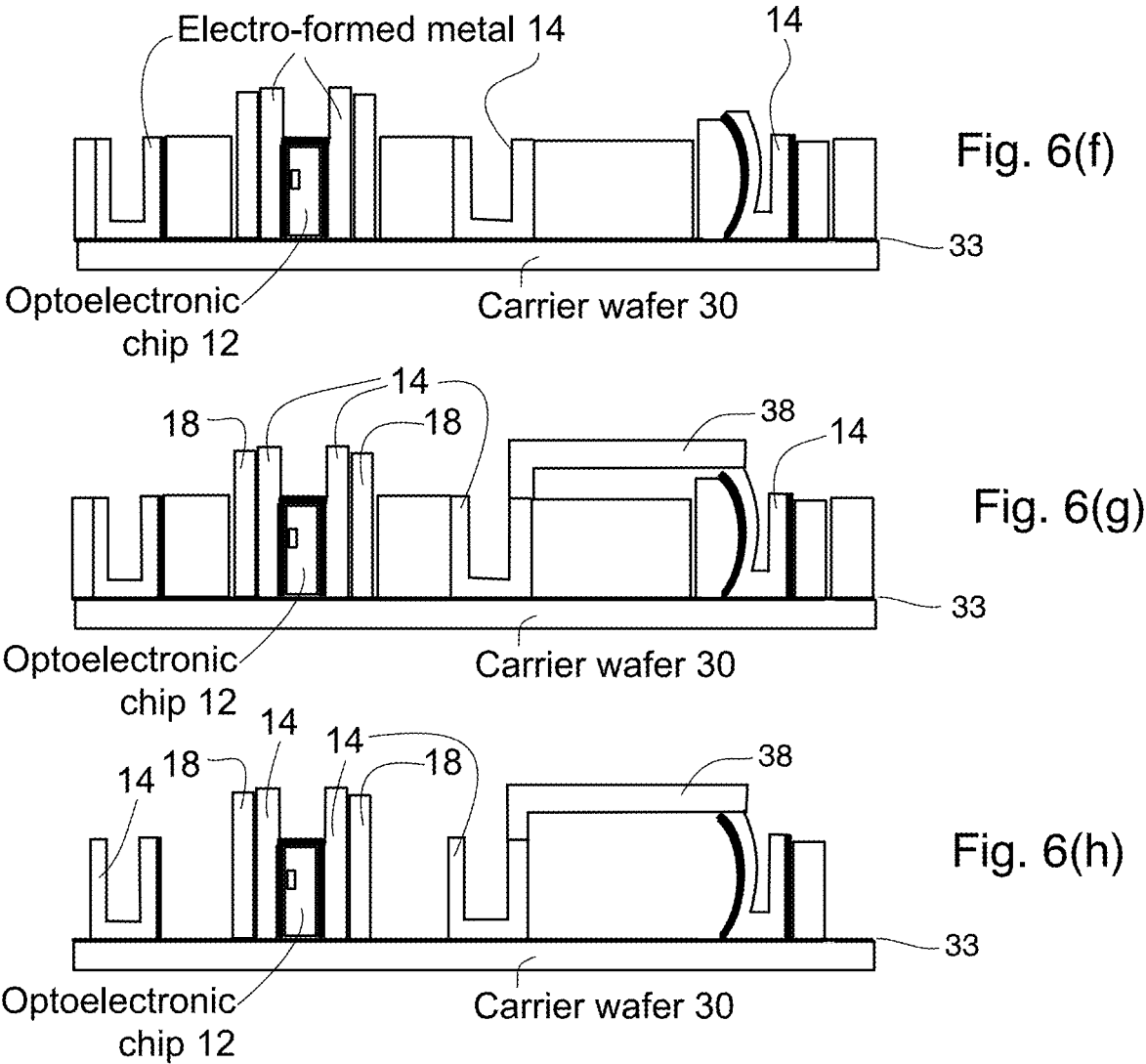
Figures 6I, 6J:
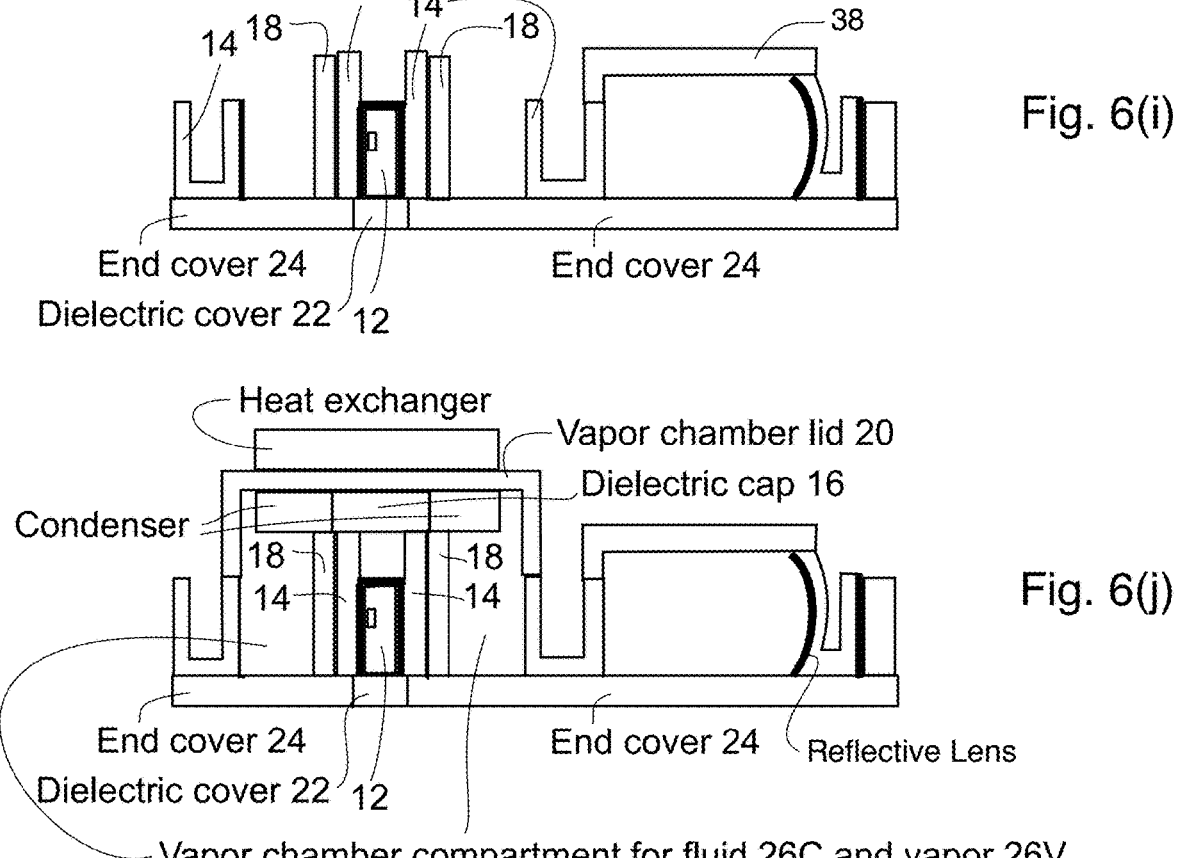

After the metal heat spreader 14 regions are electro-formed on the seed layer 34, the masking material 36, the exposed membrane layer 34, and the filler material 32 in the gaps are removed as shown by FIG. 6(f). If desired, the upper surface of the electro-formed heat spreader 14 regions may be leveled or planarized somewhat by a polishing process. One or more cap or cover pieces 38, which can be formed either of metal or dielectric material depending on placement and use, can be attached to the electro-formed metal regions 14, typically bridging multiple electro-formed metal regions (see FIG. 6(g)) to provide additional structural support if needed or desired. The sacrificial mold pieces 21, 23, plating blocks 25 and frame 27 are detached and removed as is depicted by FIG. 6(h). Also, the carrier wafer 30 is detached (see FIG. 6(i)) and replaced with metallic end cover 24 and dielectric cover 22. The two portions of end cover 24 shown in FIG. 6(i) are attached respectively to the two portions of the electro-formed metal 14 adhered to either side of the optoelectronic chip 12 whereby the two portions of end cover 24 shown in FIG. 6(i) provide positive and negative contacts for the optoelectronic chip 12. Additional cover pieces (such as vapor chamber lid 20 or the condenser or dielectric cap 16) can be attached to some of the electro-formed metal regions to construct a cooling structure such as a vapor chamber or a micro-channel fluid-flow heat sink. A heat exchanger also may be attached to the cooling structure. The resulting assembly of one embodiment of the photonic module 10 is shown in FIG. 6(j)

Multiple photonic modules could be fabricated on the same carrier wafer and using the same masking, membrane deposition, and electro-forming process steps. Thus, the fabrication cost can be shared among those multiple photonic modules.

In the module fabrication process, the various parts can be placed on the carrier wafer with high accuracy in their spatial positions and orientations. A die bonder or flip-chip bonder could be used to place these parts on the carrier wafer. The placement accuracy can be very high. For example, a SET FC150 die/flip chip bonder can have a placement accuracy within ±0.5 μm. Also, an ASM AMI-CRA Nano die and flip chip bonder can have a placement accuracy within ±0.3 μm. Such placement accuracy is especially beneficial for achieving accurate alignment of the optoelectronic chip and the various optical elements, including those made in the electro-formed metal surfaces.

The steps in the module fabrication process involve temperatures that depart only moderately from room temperature, with the maximum temperature being what is needed to bake the photoresist or to melt the wax. Such temperatures are typically no higher than 120° C. The cap and cover pieces can be attached with a low-temperature cured adhesive or a UV-cured adhesive. The electroplating is preferably done at a temperature close to room temperature. Thus, the disclosed module fabrication process avoids the high-temperature steps, such as thermo-compression bonding and solder reflow, that are typically involved in previously practiced processes for fabricating photonic modules.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom.

Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

All elements, parts and steps described herein are preferably included. It is to be understood that any of these elements, parts and steps may be replaced by other elements, parts and steps or deleted altogether as will be obvious to those skilled in the art.

What is claimed is:

1. A process for fabricating a photonic module, the process including:

providing an edge-emitting laser chip having a first and a second opposite sides that are used for making electrical connections to the chip, the laser chip having an active region with a longitudinal laser axis; and further comprising two other opposing sides that are neither the first nor the second side, embodied as a third and a fourth opposite sides, wherein one of the third and fourth opposing sides are each normal to the longitudinal laser axis fifth and sixth opposing sides that are neither the first nor the second nor the third nor the fourth sides; and placing the fifth side of said laser chip on a surface of a carrier substrate such that the third and a fourth opposite sides are normal to the surface of the carrier substrate and the longitudinal laser axis is parallel to the surface of the carrier substrate.

2. A process for fabricating a photonic module according to claim 1 wherein the process further includes electroforming first and second metal regions to at least partially cover the first and second opposing sides of the optoelectronic chip and, in use, using said first and second metal regions for making electrical connections to the optoelectronic chip via said first and second sides; wherein the first and second metal regions are arranged such that there exists between the first and second metal regions a light path to the at least one of these two other opposing sides used for coupling light to/from the chip.

3. A process for fabricating a photonic module according to claim 2 wherein the process further includes covering portions only of the third and fourth opposing sides of the optoelectronic chip with electro-formed metal-such that light can be emitted from said active region along said longitudinal laser axis.

4. A process for fabricating a photonic module according to claim 1 wherein the process further includes covering a portion of the sixth side with electro-formed metal.

5. A process for fabricating a photonic module according to claim 1 wherein the process further includes placing a mold piece on the carrier substrate.

6. A process for fabricating a photonic module according to claim 5 wherein the process further includes electroforming a metal region to cover at least one side of the mold piece, wherein the mold piece defines a shape of the electroformed metal region in proximity with the mold piece.

7. A process for fabricating a photonic module according to claim 6 wherein the process further includes a step of releasing the mold piece from the electro-formed metal region.

8. A process for fabricating a photonic module according to claim 1 wherein the process further includes placing at least one of an optical element on the carrier substrate, the at least one optical element being arranged for interacting with light emitted along the longitudinal laser axis.

9. A process for fabricating a photonic module according to claim 8 wherein the electro-forming of a metal region that covers one of the first and second opposing sides of the optoelectronic chip used for making electrical connections to the chip, also covers at least a portion of the optical element or a fluid wicking structure.

10. A process for fabricating a photonic module according to claim 1 wherein the process further includes placing a plating block or a frame onto the carrier substrate.

11. A process according claim 10 wherein the plating block or frame is placed in proximity with at least one of an optoelectronic chip, a mold piece, a dielectric spacer, an optical element, or a fluid wicking structure.

12. A process according to claim 11 wherein the process also includes filling a gap between a surface of the plating block and a facing surface of the optoelectronic chip, mold piece, dielectric spacer, optical element, or fluid wicking structure such that the electro-formed metal region does not cover the side of the optoelectronic chip, mold piece, dielectric spacer, optical element, or fluid wicking structure facing the plating block.

13. A process according to claim 12 further including releasing the plating block from the electro-formed metal region.

14. A process according to claim 12 further including attaching a cap or cover onto two electro-formed metal regions.

15. A process according claim 10 wherein the electro-forming of a metal region does not cover a side of the plating block or frame that is opposite the side of the block or frame facing the carrier substrate.

16. A process for fabricating a photonic module, the process including:

providing at least one optoelectronic chip having a first and a second opposite sides that are used for making electrical connections to the chip; having two other opposing sides that are neither the first nor the second side, embodied as a third and a fourth opposite sides, wherein one of the third and fourth opposing sides is a light coupling side of said optoelectronic chip, and having fifth and sixth opposing sides that are neither the first nor the second nor the third nor the fourth sides; and attaching on a surface of a carrier wafer one of the fifth and sixth opposing sides of said optoelectronic chip;

sandwiching the optoelectronic chip between first and second electrically distinct metal regions arranged to connect electrically the first and second opposing sides, respectively, while serving, in use, as heat spreaders for conducting heat away from the optoelectronic chip; wherein the first and second metal regions are arranged at least partially on said surface of the carrier wafer such that there exists a light path to the coupling side of the chip between the first and second metal regions, parallel to said surface of the carrier wafer; and placing at least one optical element on the carrier substrate, the at least one optical element being arranged for interacting with light coupled to the coupling side of the chip along the light path.

17. The process of claim 16, wherein at least one of the first and second metal region forms at least a portion of a fluid chamber.

18. The process of claim 16, wherein the optical element is one of a refractive or diffractive lens piece, a partially reflective mirror or optical coupler piece, a spatial light modulator piece, a diffractive grating piece, an optical aperture or a window for a laser light directed at or emitted from the coupling side of the chip along the light path.

\* \* \* \* \*